United States Patent
Polimeni et al.

(10) Patent No.: US 10,228,434 B2
(45) Date of Patent: Mar. 12, 2019

(54) MULTI-SHOT ECHO PLANAR IMAGING USING REORDERED SEGMENTS AND RF EXCITATION PULSE PHASE AND SLICE PROFILES MATCHED ACROSS INTERLEAVES

(71) Applicant: The General Hospital Corporation, Boston, MA (US)

(72) Inventors: Jonathan R Polimeni, Cambridge, MA (US); Thomas Witzel, Boston, MA (US)

(73) Assignee: The General Hospital Corporation, Boston, MA (US)

( * ) Notice: Subject to any disclaimer, the term of this patent is extended or adjusted under 35 U.S.C. 154(b) by 120 days.

(21) Appl. No.: 15/586,005

(22) Filed: May 3, 2017

(65) Prior Publication Data
US 2017/0322279 A1   Nov. 9, 2017

Related U.S. Application Data

(60) Provisional application No. 62/331,090, filed on May 3, 2016.

(51) Int. Cl.
*G01R 33/483* (2006.01)
*G01R 33/561* (2006.01)
*G01R 33/565* (2006.01)

(52) U.S. Cl.
CPC ..... *G01R 33/5616* (2013.01); *G01R 33/4833* (2013.01); *G01R 33/5659* (2013.01)

(58) Field of Classification Search
CPC ............ G01R 33/5616; G01R 33/4833; G01R 33/5659
See application file for complete search history.

(56) References Cited

U.S. PATENT DOCUMENTS

| | | | | |
|---|---|---|---|---|
| 2008/0287773 A1* | 11/2008 | Harvey | .............. | G01R 33/4804 600/412 |
| 2011/0251477 A1* | 10/2011 | Schmitt | ................ | A61B 5/0263 600/410 |
| 2012/0013336 A1* | 1/2012 | Hetzer | ................ | G01R 33/4818 324/309 |

* cited by examiner

*Primary Examiner* — Rodney A Bonnette
(74) *Attorney, Agent, or Firm* — Quarles & Brady LLP

(57) ABSTRACT

Described here are systems and methods for producing images with a magnetic resonance imaging ("MRI") system using a high-resolution, motion-robust, artifact-free segmented echo planar imaging ("EPI") technique. In particular, a fast low angle excitation echo planar imaging technique ("FLEET") using variable flip angle ("VFA") radio frequency ("RF") excitation pulses that are specifically designed to have a flat magnitude and phase profile across a slice for a range of different flip angles.

11 Claims, 3 Drawing Sheets

MULTI-SHOT ECHO PLANAR IMAGING USING REORDERED SEGMENTS AND RF EXCITATION PULSE PHASE AND SLICE PROFILES MATCHED ACROSS INTERLEAVES

CROSS-REFERENCE TO RELATED APPLICATIONS

This application claims the benefit of U.S. Provisional Patent Application Ser. No. 62/331,090, filed on May 3, 2016, and entitled "MULTI-SHOT ECHO PLANAR IMAGING USING REORDERED SEGMENTS AND RF EXCITATION PULSE PHASE AND SLICE PROFILES MATCHED ACROSS INTERLEAVES."

STATEMENT REGARDING FEDERALLY SPONSORED RESEARCH

This invention was made with government support under EB019437 awarded by the National Institutes of Health. The government has certain rights in the invention.

BACKGROUND OF THE INVENTION

Echo planar imaging ("EPI") is a widely deployed magnetic resonance imaging ("MRI") pulse sequence designed for rapid imaging. EPI is used for its ability to essentially freeze motion and acquire time-series data that are can be used for functional, diffusion, perfusion, and permeability imaging. Despite its broad use in both clinical and research applications, EPI is vulnerable to intrinsic image artifacts such as geometric distortion and blurring. The severity of these artifacts increase with the total time required to sample a given image frame. Therefore, several techniques have been proposed to minimize the acquisition time of EPI.

One such strategy is to employ parallel imaging techniques to accelerate the acquisition by skipping a portion of the image encoding steps, which shortens the total acquisition time. The skipped data are then estimated through image reconstruction techniques (e.g., GRAPPA) that exploit the partially-redundant information acquired through the channels of RF receive coil arrays. While accelerated parallel imaging can reduce these image artifacts, the amount of acceleration is limited by the number of available channels in the array. Parallel imaging techniques are also disadvantaged by signal-to-noise penalties that are incurred because of the reduced signal averaging available in accelerated acquisitions and by the noise enhancement caused by the associated image reconstruction methods.

A classic method for reducing distortion and blurring in EPI is to divide the image into multiple interleaved segments and acquire these segments separately. Thus, instead of acquiring the entire image frame after one shot in one segment, these techniques acquire the image piecemeal over several shots. This approach results in less distortion and blurring because the acquisition time for each segment is reduced compared to a single-shot acquisition. Unfortunately, conventional multi-shot EPI has a long vulnerable period during which dynamic effects (e.g., patient motion and/or breathing) can cause strong artifacts, precluding its widespread use.

One strategy to reduce this motion vulnerability is to change the temporal order in which the segments (which are interleaved in k-space) are acquired using the Fast Low-Excitation Echo-planar Technique ("FLEET"). This technique acquires all segments of a given image slice consecutively in time in order to shorten this vulnerable period and make the acquisition more robust. Because this reordering leaves no time for signal to recover between shots in a given slice, proper use of the FLEET method either requires the segments to be acquired with constant, low flip angles ("CLFA") or with a variable flip angle ("VFA") schedule in which the flip angle progressively increases with each shot (based on the recovery time and the tissue longitudinal relaxation value). While the CLFA approach can provide robustness, it sacrifices image signal-to-noise ratio by up to 80 percent. This loss of sensitivity is acceptable in some applications (e.g., using CLFA-FLEET for the acquisition of secondary data including motion-robust calibration data for accelerated parallel imaging reconstruction techniques), but may not be acceptable in cases where the FLEET acquisition is used for the primary imaging in which maximal sensitivity is desirable.

The VFA approach also provides robustness, but is plagued by strong image artifacts caused by the distribution of longitudinal relaxation rates found in patients (i.e., when more than one tissue is present) and because slice profiles and through-plane image phase vary greatly with increasing flip angle. Increasing the flip angle of a standard excitation pulse by increasing its voltage and therefore the excitation field causes distortions of the slice profile and phase across the slice in a flip angle dependent way. This flip angle dependent phase shift has precluded the use of VFA-FLEET because the distinct phase imparted on each interleaved segment causes a phase modulation across k-space that leads to strong ghosting artifacts in the final image.

SUMMARY OF THE DISCLOSURE

The present disclosure addresses the aforementioned drawbacks by providing a method for producing an image of a subject using a magnetic resonance imaging ("MRI") system in which k-space data are acquired from a slice in a subject using the MRI system to perform a pulse sequence. The pulse sequence includes a multi-shot variable flip angle ("VFA") radio frequency ("RF") excitation that excites spins in the slice and comprises a plurality of different RF excitation pulses each having a flip angle not greater than 90 degrees, and a multi-shot echo planar imaging ("EPI") data acquisition that acquires k-space data after each RF excitation pulse by sampling magnetic resonance signals generated by the excited spins in a plurality of different interleaved segments of k-space. Each of the plurality of different RF excitation pulses is designed such that slice profiles and through-plane phase of the plurality of different RF excitation pulses are matched for each of the different interleaved segments of k-space. An image of the subject is then reconstructed from the acquired k-space data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

BRIEF DESCRIPTION OF THE DRAWINGS

1A shows a conventional SLR pulse design, which results in small differences in slice profile (seen in the $M_y$ component) as well as a substantial difference in phase (seen in the $M_x$ component) between the 45 degree and 90 degree flip angle pulses. FIG. 1B shows the DIST pulse design described here, which provides both an early identical slice profile as well as a flat phase across the slice for both pulses.

DETAILED DESCRIPTION

Figure 1A:
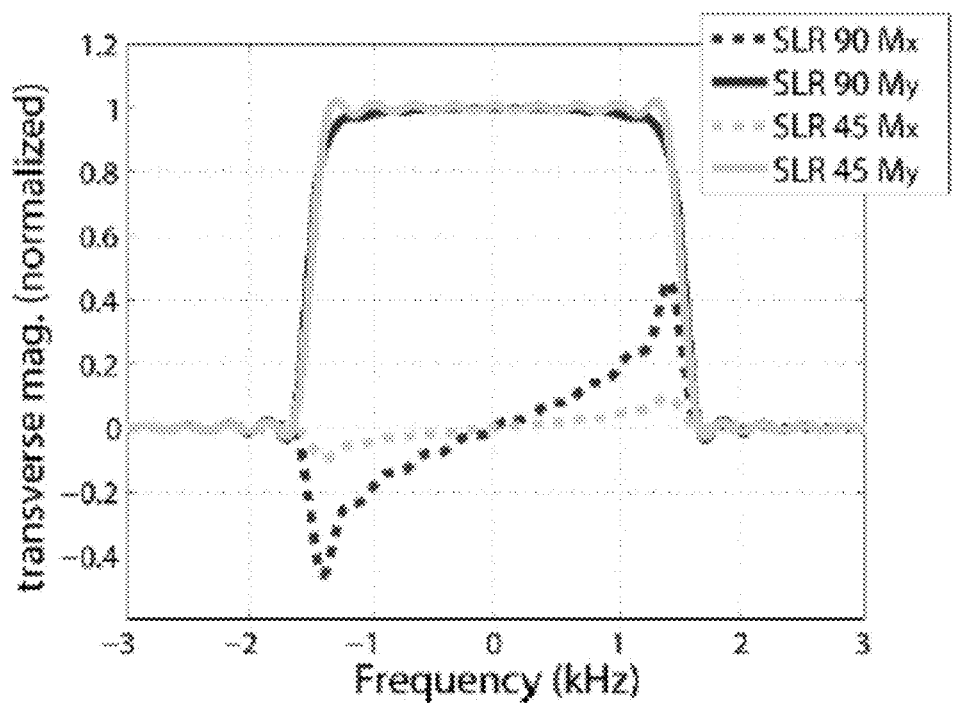
FIGS. 1A and 1B show excitation RF pulse designs for first and second interleaves of a 2-shot segmented EPI acquisition using a 45 degree and 90 degree flip angle. FIG.

Described here are systems and methods for producing images with a magnetic resonance imaging ("MRI") system using a high-resolution, motion-robust, artifact-free segmented echo planar imaging ("EPI") technique. In particular, the systems and methods implement a fast low angle excitation echo planar imaging technique ("FLEET") using variable flip angle ("VFA") radio frequency ("RF") excitation pulses that are specifically designed to have a flat magnitude and phase profile across a slice for a range of different flip angles.

As mentioned above, VFA techniques are commonly disadvantaged because conventional Shinnar-Le Roux ("SLR") RF excitation pulses have slice profiles and through-plane image phase that vary significantly with increasing flip angle. Thus, when used for VFA-FLEET techniques, SLR RF excitation pulses impart a distinct phase on each interleaved segment, thereby causing a phase modulation across k-space that leads to strong ghosting artifacts in the final image.

The systems and methods described here overcome the drawbacks of previous VFA-FLEET acquisitions by designing the set of N RF pulses and associated slice-select gradient waveforms used in an N-shot segmented EPI pulse sequence to force the slice profile and through-plane phase imparted on the image by the RF excitation pulses to be consistent across the k-space interleaves. This improvement overcomes the strong image artifacts that preclude the use of VFA-FLEET for most applications including high-sensitivity, high-resolution EPI.

It is one aspect of the systems and methods described here to scale the signal intensities across segments during image reconstruction. As one example, this scaling can be achieved using a least-squares fitting that balances signal levels across the k-space interleaves. In other examples, different normalization schemes could be used to force the signal intensities to better match across k-space segments.

In general, the methods described in the present disclosure design RF excitation pulses such that the slice profiles and through-plane phase are designed to match across k-space interleaves. Together, these improvements eliminate the strong image artifacts seen in previous VFA-FLEET approaches. This improved approach can be used for high-resolution EPI while also providing high SNR, and is fully compatible with other techniques such as parallel imaging which, when combined, can provide extremely valuable high-resolution imaging.

As one example, the RF excitation pulses are designed to having slice profiles (e.g., magnitude) and through-plane phase that are matched across interleaved k-space segments based at least in part on a discrete inverse scattering transform ("DIST") (e.g., using a DIST algorithm). As another example, the RF excitation pulses can be designed such that the slice profiles and through-plane phase are matched across k-space interleaves using so-called "optimal control" algorithms, which generally involve solutions to the Bloch equations. Examples of optimal control algorithms are described by S. Conolly, D. Nishimura, and A. Macovski in "Optimal Control Solutions to the Magnetic Resonance Selective Excitation Problem," *IEEE Transactions on Medical Imaging*, vol. MI-5, No. 2, June 1986, pp. 106-115.

Figure 1B:
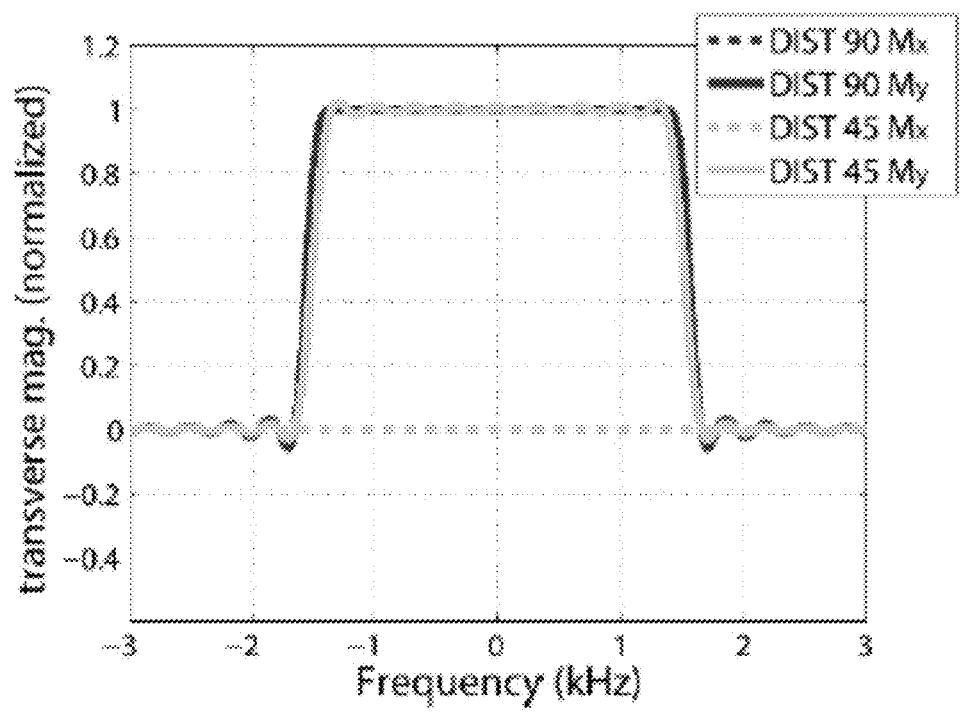

A comparison between commonly used SLR RF pulses and the DIST RF pulses used by the systems and methods described here is shown in FIGS. 1A and 1B. FIG. 1A shows two SLR RF excitation pulses: one corresponding to a 90 degree flip angle and one corresponding to a 45 degree flip angle. The profiles of these SLR pulses, which are optimized independently to achieve a flat slice profile (i.e., in this case a flat $M_y$ waveform) with a sharp transition, do not match perfectly. More importantly, the phase of both SLR pulses (i.e., captured by the $M_x$ waveform) not only varies across the slice profile, but the variation is different between the two SLR pulses. Notably, the phase variation is significantly greater in the SLR pulse corresponding to the 90 degree flip angle than that of the 45 degree flip angle.

FIG. 1B shows two DIST RF excitation pulses: one corresponding to a 90 degree flip angle and one corresponding to a 45 degree flip angle. These DIST pulses are designed to produce a flat profile that is matched between the two flip angles. Furthermore, the DIST pulses are designed to achieve a flat phase profile across the slice for both flip angles. Based on the matched magnitude profiles, and the lack of phase variations across the slice profile, these DIST pulses can be used to implement a VFA-FLEET acquisition without the ghosting artifacts associated with previous VFA-FLEET acquisitions.

Thus, in some embodiments, custom-designed DIST RF pulses are integrated into a VFA-FLEET segmented EPI acquisition to ensure that the RF pulses do not impose phase shifts between the interleaves. Applications of the high-resolution, motion-robust, artifact-free segmented EPI methods described here include all domains which predominantly use EPI, including functional, diffusion, and perfusion imaging. Several new applications are also possible because in many domains the relatively low spatial resolution of conventional EPI is insufficient. With the potential for high-resolution imaging provided by the methods described here, the proposed segmented EPI methods could be advantageous for imaging patient populations prone to motion (e.g., uncomfortable/uncooperative patients and pediatric patients), where fast imaging with low distortion/blurring and high resolution is required.

Figure 2:
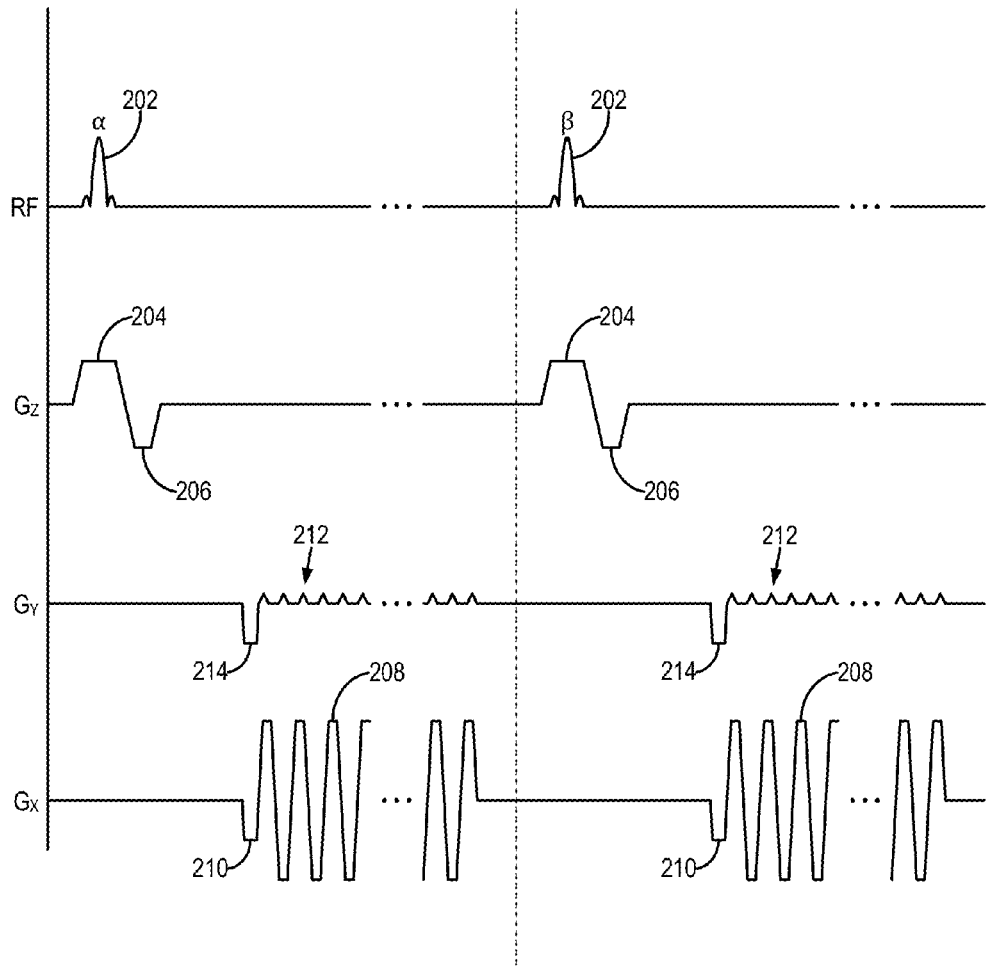
FIG. 2 is an example pulse sequence that implements a DIST-VFA-FLEET imaging scheme.

Referring now to FIG. 2, an example pulse sequence diagram for a VFA-FLEET imaging technique using RF excitation pulses designed according to the methods described in the present disclosure is illustrated. In this example, two EPI segments, and thus two shots, are implemented; however, the methods described in the present disclosure can also be implemented with pulse sequences with a greater number of shots. The pulse sequence generally includes multiple "shots" or RF excitations that include a plurality of RF excitation pulses and associated slice-select gradient pulses, each followed by an echo planar imaging ("EPI") acquisition. Each shot of the pulse sequence includes an RF excitation pulse 202 that is played out in the presence of a slice-select gradient 204 in order to produce transverse magnetization in a prescribed imaging slice. As described above, the RF excitation pulse 202 is a DIST RF pulse. Together, these improvements eliminate the strong image artifacts seen in previous VFA-FLEET approaches.

This improved approach can be used for high-resolution EPI while also providing high SNR, and is fully compatible with other techniques such as parallel imaging which, when combined, can provide extremely valuable high-resolution imaging.

The slice-select gradient 204 includes a rephasing lobe 206 that acts to rephase unwanted phase dispersions introduced by the slice-select gradient 204, such that signal losses resultant from these phase dispersions are mitigated. Although FIG. 2 shows the same slice-select gradient 204 and rephasing lobe 206 being used for each shot, in other embodiments the slice-select gradient 204, rephasing lobe 206, or both, can differ between shots.

Following excitation of the nuclear spins in the prescribed imaging slice, data within a given segment are acquired by sampling a series of echo signals in the presence of an alternating readout gradient 208. The alternating readout gradient 208 is preceded by the application of a pre-winding gradient 210 that acts to move the first sampling point along the frequency-encoding, or readout, direction by a prescribed distance in k-space. Spatial encoding of the echo signals along a phase-encoding direction can be performed by a series of phase-encoding gradient blips 212, which are played out between the lobes of the alternating readout gradient 208 such that each echo signal is separately phase-encoded. The phase-encoding gradient blips 212 are preceded by the application of a pre-winding gradient 214 that acts to move the first sampling point along the phase-encoding direction by a prescribed distance in k-space. In some embodiments, the pre-winding gradient 214 will be different between multiple shots because each interleave acquires a different set of k-space lines. Together, the pre-winding gradients 210 and 214 act to begin the sampling of k-space at a prescribed k-space location.

This pulse sequence for a given segment is repeated a plurality of times to acquire the full set of k-space data for a given slice. In subsequent repetitions of the pulse sequence, the flip angle of the RF excitation pulse 202 is varied. For instance, the flip angle may be α in one repetition and may be β≠α in a subsequent repetition, as illustrated in FIG. 2. As described above, the RF excitation pulses 202 are specifically designed such that the slice profiles and through-plane phase are matched across k-space interleaves, regardless of the flip angle associated with the RF excitation pulse 202.

The pre-winding gradient 214 prior to the phase-encoding gradient blips 212 may differ between segments to allow the phase-encoding gradient blips 212 to encode a different set of k-space lines in each interleave. In the two-segment example, the first interleave may include the odd-numbered k-space lines and the second interleave may include the even-numbered k-space lines, such that the two interleaves sample the full set of k-space lines for a given image slice.

In another embodiment, each of the two interleaves may include every fourth line of k-space, such that together the two interleaves sample only half of the k-space lines in a given image. In this undersampled case, the missing k-space lines can be estimated with parallel imaging reconstruction techniques, such as GRAPPA.

This pulse sequence for acquiring all segments in a single image slice may be repeated a plurality of times while applying a different slice-selective gradient 204 during each repetition such that a plurality of slice locations are sampled.

Figure 3:
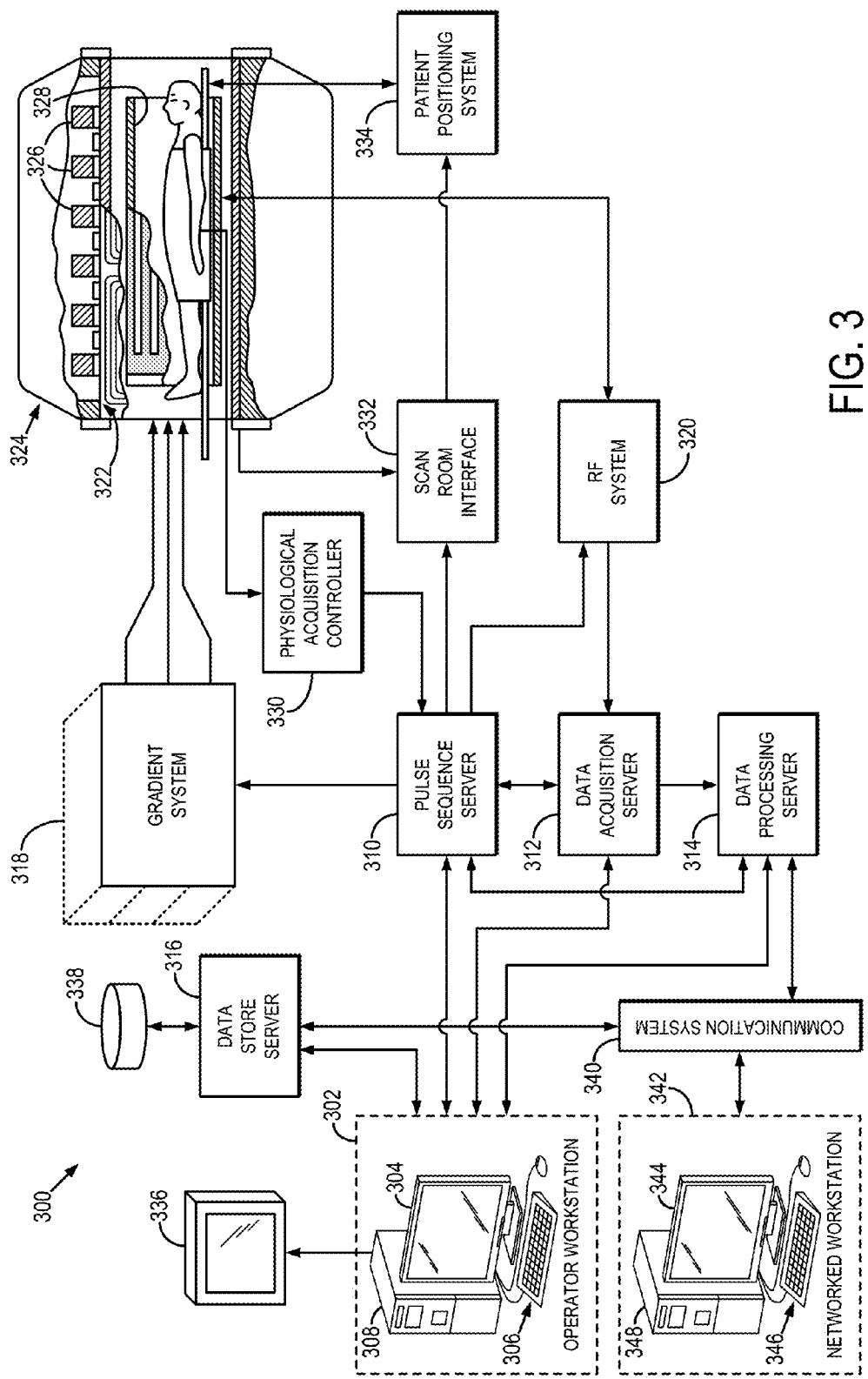
FIG. 3 is a block diagram of an example magnetic resonance imaging ("MRI") system that can implement the methods described here.

Referring particularly now to FIG. 3, an example of a magnetic resonance imaging ("MRI") system 300 that can implement the methods described here is illustrated. The MRI system 300 includes an operator workstation 302 that may include a display 304, one or more input devices 306 (e.g., a keyboard, a mouse), and a processor 308. The processor 308 may include a commercially available programmable machine running a commercially available operating system. The operator workstation 302 provides an operator interface that facilitates entering scan parameters into the MRI system 300. The operator workstation 302 may be coupled to different servers, including, for example, a pulse sequence server 310, a data acquisition server 312, a data processing server 314, and a data store server 316. The operator workstation 302 and the servers 310, 312, 314, and 316 may be connected via a communication system 340, which may include wired or wireless network connections.

The pulse sequence server 310 functions in response to instructions provided by the operator workstation 302 to operate a gradient system 318 and a radiofrequency ("RF") system 320. Gradient waveforms for performing a prescribed scan are produced and applied to the gradient system 318, which then excites gradient coils in an assembly 322 to produce the magnetic field gradients $G_x$, $G_y$, and $G_z$ that are used for spatially encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil to perform the prescribed magnetic resonance pulse sequence. Responsive magnetic resonance signals detected by the RF coil 328, or a separate local coil, are received by the RF system 320. The responsive magnetic resonance signals may be amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the prescribed scan and direction from the pulse sequence server 310 to produce RF pulses of the desired frequency, phase, and pulse amplitude waveform. The generated RF pulses may be applied to the whole-body RF coil 328 or to one or more local coils or coil arrays.

The RF system 320 also includes one or more RF receiver channels. An RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \qquad (1);$$

and the phase of the received magnetic resonance signal may also be determined according to the following relationship:

$$\varphi = \tan^{-1}\left(\frac{Q}{I}\right). \qquad (2)$$

The pulse sequence server 310 may receive patient data from a physiological acquisition controller 330. By way of example, the physiological acquisition controller 330 may receive signals from a number of different sensors connected to the patient, including electrocardiograph ("ECG") signals from electrodes, or respiratory signals from a respiratory bellows or other respiratory monitoring devices. These signals may be used by the pulse sequence server 310 to synchronize, or "gate," the performance of the scan with the subject's heart beat or respiration.

The pulse sequence server 310 may also connect to a scan room interface circuit 332 that receives signals from various sensors associated with the condition of the patient and the magnet system. Through the scan room interface circuit 332, a patient positioning system 334 can receive commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, so that data is not lost by data overrun. In some scans, the data acquisition server 312 passes the acquired magnetic resonance data to the data processor server 314. In scans that require information derived from acquired magnetic resonance data to control the further performance of the scan, the data acquisition server 312 may be programmed to produce such information and convey it to the pulse sequence server 310. For example, during pre-scans, magnetic resonance data may be acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also process magnetic resonance signals used to detect the arrival of a contrast agent in a magnetic resonance angiography ("MRA") scan. For example, the data acquisition server 312 may acquire magnetic resonance data and processes it in real-time to produce information that is used to control the scan.

The data processing server 314 receives magnetic resonance data from the data acquisition server 312 and processes the magnetic resonance data in accordance with instructions provided by the operator workstation 302. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 314 are conveyed back to the operator workstation 302 for storage. Real-time images may be stored in a data base memory cache, from which they may be output to operator display 302 or a display 336. Batch mode images or selected real time images may be stored in a host database on disc storage 338. When such images have been reconstructed and transferred to storage, the data processing server 314 may notify the data store server 316 on the operator workstation 302. The operator workstation 302 may be used by an operator to archive the images, produce films, or send the images via a network to other facilities.

The MRI system 300 may also include one or more networked workstations 342. For example, a networked workstation 342 may include a display 344, one or more input devices 346 (e.g., a keyboard, a mouse), and a processor 348. The networked workstation 342 may be located within the same facility as the operator workstation 302, or in a different facility, such as a different healthcare institution or clinic.

The networked workstation 342 may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342.

The present disclosure has described one or more preferred embodiments, and it should be appreciated that many equivalents, alternatives, variations, and modifications, aside from those expressly stated, are possible and within the scope of the invention.

The invention claimed is:

1. A method for producing an image of a subject using a magnetic resonance imaging (MRI) system, the steps of the method comprising:
   (a) acquiring k-space data from a slice in a subject using the MRI system to perform a pulse sequence that includes:
      a multi-shot variable flip angle (VFA) radio frequency (RF) excitation that excites spins in the slice and comprises a plurality of different RF excitation pulses each having a flip angle not greater than 90 degrees;
      a multi-shot echo planar imaging (EPI) data acquisition that acquires k-space data after each RF excitation pulse by sampling magnetic resonance signals generated by the excited spins in a plurality of different interleaved segments of k-space;
   (b) reconstructing an image of the subject from the acquired k-space data; and
   wherein each of the plurality of different RF excitation pulses is designed such that a slice profile and through-plane phase of the plurality of different RF excitation pulses are matched for each of the different interleaved segments of k-space.

2. The method as recited in claim 1, wherein each of the plurality of different RF excitation pulses is designed such that the slice profiles and through-plane phase of each of the plurality of different RF excitation pulses are matched for each of the different interleaved segments of k-space based at least in part on a discrete inverse scattering transform (DIST).

3. The method as recited in claim 1, wherein each of the plurality of different RF excitation pulses is designed such that the slice profiles and through-plane phase of each of the plurality of different RF excitation pulses are matched for each of the different interleaved segments of k-space using an optimum control algorithm.

4. The method as recited in claim 1, the through-plane phase of each RF excitation pulse is designed to be consistent across the different interleaved segments of k-space.

5. The method as recited in claim 4, wherein the through-plane phase of each RF excitation pulse is designed to be zero across the different interleaved segments of k-space.

6. The method as recited in claim 1, wherein the EPI data acquisition is a fast low-angle excitation echo-planar technique (FLEET) in which the segments of k-space for the slice are acquired consecutively in time.

7. The method as recited in claim 1, wherein the plurality of different RF excitation pulses are designed to scale signal intensities across the segments of k-space such that signal levels across the interleaved segments of k-space are balanced.

8. The method as recited in claim 1, wherein step (b) includes scaling signal intensities in the acquired k-space data across the segments of k-space during image reconstruction.

9. The method as recited in claim 8, wherein the signal intensities are scaled by normalizing the signal intensities in order to match the signal intensities across the segments of k-space.

10. The method as recited in claim 9, wherein the signal intensities are scaled using a least-squares fitting.

11. The method as recited in claim 1, wherein the EPI data acquisition is undersampled by skipping k-space lines during the EPI data acquisition, and wherein step (b) includes estimating the k-spaces lines skipped during the EPI data acquisition using a parallel imaging reconstruction technique.

* * * * *